United States Patent
Park et al.

(10) Patent No.: US 11,001,732 B2
(45) Date of Patent: May 11, 2021

(54) POLISHING SLURRY COMPOSITION

(71) Applicant: Dongjin Semichem Co., Ltd., Incheon (KR)

(72) Inventors: Hye Jung Park, Gyeonggi-do (KR); Jae Hyun Kim, Seoul (KR); Jong Dai Park, Seoul (KR); Min Gun Lee, Seoul (KR); Jong Chul Shin, Gyeonggi-do (KR); Sung Hoon Jin, Gyeonggi-do (KR)

(73) Assignee: Dongjin Semichem Co., Ltd., Incheon (KR)

( * ) Notice: Subject to any disclaimer, the term of this patent is extended or adjusted under 35 U.S.C. 154(b) by 0 days.

(21) Appl. No.: 16/189,236

(22) Filed: Nov. 13, 2018

(65) Prior Publication Data

US 2019/0077994 A1 Mar. 14, 2019

Related U.S. Application Data

(63) Continuation-in-part of application No. PCT/KR2017/005118, filed on May 17, 2017.

(30) Foreign Application Priority Data

May 19, 2016 (KR) .................. 10-2016-0061230

(51) Int. Cl.
| | | |
|---|---|---|
| C09G 1/02 | (2006.01) | |
| C09K 3/14 | (2006.01) | |
| H01L 21/3105 | (2006.01) | |
| H01L 21/304 | (2006.01) | |
| H01L 21/321 | (2006.01) | |

(52) U.S. Cl.
CPC .............. *C09G 1/02* (2013.01); *C09K 3/1436* (2013.01); *H01L 21/304* (2013.01); *H01L 21/31053* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 3,922,393 A | 11/1975 | Sears, Jr. | |
| 4,959,113 A | 9/1990 | Roberts | |
| 5,366,542 A | 11/1994 | Yamada et al. | |
| 6,258,140 B1 | 7/2001 | Shemo et al. | |
| 7,887,715 B1 * | 2/2011 | Park | H01L 21/3212 252/79.1 |
| 8,038,752 B2 * | 10/2011 | Carter | C09G 1/02 51/307 |
| 2003/0110711 A1 | 6/2003 | Ota et al. | |
| 2003/0176072 A1 | 9/2003 | Wang et al. | |
| 2004/0107650 A1 | 6/2004 | Siddiqui et al. | |
| 2005/0104048 A1 | 5/2005 | Thomas et al. | |
| 2006/0086055 A1 | 4/2006 | Carter | |
| 2007/0176142 A1 * | 8/2007 | Kikuchi | B24B 37/044 252/79.1 |
| 2009/0314744 A1 | 12/2009 | Vacassy et al. | |
| 2009/0317638 A1 | 12/2009 | Kawabata et al. | |
| 2014/0263170 A1 | 9/2014 | Long et al. | |
| 2016/0222254 A1 | 8/2016 | Huang et al. | |
| 2016/0247693 A1 | 8/2016 | Park et al. | |
| 2017/0247574 A1 | 8/2017 | Takahashi et al. | |

FOREIGN PATENT DOCUMENTS

| | | |
|---|---|---|
| CN | 1289811 A | 4/2001 |
| CN | 1434846 A | 8/2003 |
| CN | 1629238 A | 6/2005 |
| CN | 101044220 A | 9/2007 |
| CN | 101490200 A | 7/2009 |
| CN | 101541476 A | 9/2009 |
| CN | 104137182 A | 11/2014 |
| CN | 104588568 A | 5/2015 |
| CN | 104650739 A | 5/2015 |
| CN | 105189043 A | 12/2015 |
| CN | 107207910 A | 9/2017 |
| JP | S60-86186 A | 5/1985 |
| JP | H11-21545 A | 1/1999 |
| JP | 2003-197573 A | 7/2003 |
| JP | 2006-231436 A | 9/2006 |
| JP | 2009-238930 A | 10/2009 |
| JP | 2009-289887 A | 12/2009 |
| KR | 10-2007-0106450 A | 11/2007 |
| KR | 10-2008-0000518 A | 1/2008 |
| TW | 200516122 A | 5/2005 |
| TW | 200738854 A | 10/2007 |
| TW | 200804575 A | 1/2008 |
| TW | 200804578 A | 1/2008 |
| WO | 2006-049892 A2 | 5/2006 |
| WO | 2015-060610 A1 | 4/2015 |
| WO | 2016-063505 A1 | 4/2016 |

OTHER PUBLICATIONS

International Search Report dated Aug. 28, 2017 in corresponding International Application No. PCT/KR2017/005118.

* cited by examiner

*Primary Examiner* — Roberts P Culbert
(74) *Attorney, Agent, or Firm* — Nelson Mullins Riley & Scarborough LLP; Kongsik Kim, Esq.

(57) ABSTRACT

Disclosed is a chemical-mechanical polishing slurry composition having a small change in pH over time under an acidic condition and thus being easy to store for a long time. The chemical-mechanical polishing slurry composition includes an abrasive; an amount of about 0.000006 to 0.01 weight % of an aluminum component based on the total weight of the polishing slurry composition; and water. The number of silanol groups on a surface of the abrasive and a content of the aluminum component satisfy the requirements of following Equation 1:

$$0.0005 \leq (S*C)*100 \leq 4.5, \quad \text{[Equation 1]}$$

wherein, S is the number of the silanol groups present on 1 nm$^2$ of the abrasive surface (unit: number/nm$^2$), and C is the content of the aluminum component (weight %) in the slurry composition.

15 Claims, No Drawings

POLISHING SLURRY COMPOSITION

CROSS REFERENCE TO RELATED APPLICATION

This application is a continuation-in-part application of International Patent Application No. PCT/KR2017/005118, filed May 17, 2017, which claims the benefit of priority of Korean Patent Application No. 10-2016-0061230, filed May 19, 2016, which are hereby expressly incorporated by reference in their entirety.

FIELD OF THE INVENTION

The present invention relates to a polishing slurry composition, particularly to a chemical-mechanical polishing slurry composition. The polishing slurry composition of the present invention may prevent change such as pH of the slurry composition over time under an acidic condition and thus may have good storage property for a long time.

BACKGROUND OF THE INVENTION

A semiconductor chip to which an integrated circuit technology is applied includes a number of functional elements such as transistors, capacitors, resistors, and the like, and these individual functional elements are connected to each other by a wire patterned in a predetermined shape to form a circuit. The size of the integrated semiconductor chip has been reduced and the functionality thereof has been expanded over several generations. In the related arts, as the size of the electrical elements has been reduced, multilevel interconnection technologies of the electrical elements have been actively studied and developed. For example, for manufacturing the semiconductor device with the multilevel interconnection, the planarization process of metal film should be carried out. Generally, it is not easy to polish the metal film because of the metal film having high strength, therefore for effectively polishing the metal film, the metal film is transformed to metal oxide which has relatively low strength and then is polished. For example, when silica is used as an abrasive in the slurry composition for polishing a metal film, the longer the storage time of the slurry composition in an acidic condition, the more changes such as an increase in particle size or pH over time, which may lead to problems in its shelf life time.

SUMMARY OF THE INVENTION

Provided herein, inter alia, is a polishing slurry composition, or a chemical-mechanical polishing slurry composition. The polishing slurry composition may have a long-term storage stability with a little change in chemical and/or physical condition even in long-term storage, while maintaining excellent polishing performance, in an acidic condition.

In one aspect, the present invention provides a polishing slurry composition (or "chemical-mechanical slurry polishing composition") that may include an abrasive; an amount of about 0.000006 to 0.01 weight % of an aluminum component based on the total weight of the polishing slurry composition; and a solvent. The solvent may suitably include water.

The abrasive may suitably include one or more selected from the group consisting of fumed silica and colloidal silica. The polishing slurry composition may suitably include the abrasive in an amount of about 0.001 to 20 weight % based on the total weight of the polishing slurry composition. Preferably, a number of silanol groups on a surface of the abrasive may be from about 1 to about 10/nm².

The aluminum component may suitably include one or more selected from the group consisting of an aluminum salt, an aluminum atom and an aluminum ion. The aluminum component may be attached or absorbed on the surface of the abrasive. The aluminum component may further include one or more selected from the group consisting of chloride (Cl), sulfate ($SO_4$), ammonium ($NH_4$), potassium (K), hydroxide (OH), a methylate ($CH_3$) and phosphorus (P). Preferably, the number of the silanol groups on the surface of the abrasive and the content of the aluminum component may satisfy the requirement of the following Equation 1:

$$0.0005 \leq (S^*C)^*100 \leq 4.5,\qquad\text{[Equation 1]}$$

wherein, S is the number of the silanol groups present on 1 nm² of the surface of the abrasive (unit: number/nm²), and C is the content of the aluminum component (weight %) in the slurry composition.

The polishing slurry composition may further include an amount of about 0.005 to 10 weight % of an oxidizing agent based on the total weight of the polishing slurry composition. The polishing slurry composition may further include an amount of about 0.0001 to 0.05 weight % of a biocide based on the total weight of the polishing slurry composition. The polishing slurry composition may further include an amount of about 0.00001 to 0.5 weight % of a catalyst including nano ferrosilicon or iron salt compound based on the total weight of the polishing slurry composition.

In an another aspect, provided is a polishing slurry composition that may include an amount of about 0.001 to 20 weight % of an abrasive; an amount of about 0.000006 to 0.01 weight % of aluminum; an amount of about 0.00001 to 0.5 weight % of a catalyst including nano ferrosilicon or iron salt compound; and a solvent constituting the remaining balance of the polishing slurry composition, all the weight % are based on the total weight of the polishing slurry composition. Preferably, the solvent may include water.

The polishing slurry composition may further include a pH adjusting agent to adjust the pH to 1 to 6; and an amount of about 0.0001 to 0.05 weight % of a biocide based on the total weight of the polishing slurry composition. Preferably, the pH adjusting agent may suitably include one or more selected from the group consisting of nitric acid, hydrochloric acid, sulfuric acid, potassium hydroxide, sodium hydroxide, tetramethylammonium hydroxide, and tetrabutylammonium hydroxide. The polishing slurry composition may further include an amount of about 0.005 to 10 weight % of an oxidizing agent based on the total weight of the polishing slurry composition. Preferably, the number of the silanol groups on the surface of the abrasive and the content of the aluminum component may satisfy the requirement of the above Equation 1.

Further provided is a polishing slurry composition that may include: an amount of about 0.001 to 20 weight % of an abrasive; an amount of about 0.000006 to 0.01 weight % of an aluminum component; an amount of about 0.00001 to 0.5 weight % of a catalyst including nano ferrosilicon or iron salt compound; an amount of about 0.005 to 10 weight % of an oxidizing agent; and a solvent constituting the remaining balance of the polishing slurry composition, all the weight % are based on the total weight of the polishing slurry composition. Preferably, the solvent may include water.

According to various aspects of the present invention, by including the aluminum component, the slurry composition according to the present invention may have superior stability having improved shelf life time suitable for long time storage, and increase of scratches or polishing rate change may be prevented when using the polishing slurry composition. To the contrary, a conventional slurry composition may have decreased polishing performance and cause scratch and the polishing rate change due to the pH increase in the acidic region during with a long time.

Other aspects of the invention are disclosed infra.

DETAILED DESCRIPTION OF THE INVENTION

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprise", "include", "have", etc. when used in this specification, specify the presence of stated features, regions, integers, steps, operations, elements and/or components but do not preclude the presence or addition of one or more other features, regions, integers, steps, operations, elements, components, and/or combinations thereof.

Further, unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, the present invention will be described in detail.

In an aspect of the present invention, provided is a polishing slurry composition (or "chemical-mechanical polishing slurry composition") that includes an abrasive, and an aluminum component. In certain embodiments, the polishing slurry composition may include an abrasive containing silanol groups on a surface thereof, an aluminum component and a solvent. The slurry composition may provide improvement in polishing speed and cause less scratch formation. Additionally, the slurry composition may also have substantially improved stability and thus, for example, may be stored for a long period of time.

The "abrasive" as used herein refers to a material used for treating, modifying or improving a surface of an object by means of grinding, polishing, rubbing, sanding, finishing, or the like as applying friction to the surface together with the material. The abrasive, or the abrasive composition, may include modification or functional chemical groups imparting chemical and/or physical effects. For example, such modification may change or maintain various acid/base properties in the abrasive composition. In addition, the abrasive may include particles having suitable size or shapes to improve grinding or surface treating efficiency. Preferably, the abrasive may include particles having a diameter in nanometer scale length, for example, less than about 900 nm, less than about 800 nm, less than about 700 nm, less than about 600 nm, less than about 500 nm, less than about 400 nm, less than about 300 nm, or less than about 200 nm.

In certain embodiments, the abrasive may be used for polishing a film on an object, for example, an oxide film. The abrasive may include a silica-based abrasive such as fumed silica, colloidal silica, or a mixture thereof is used. The abrasive may be a silica-based abrasive, as such the abrasive may suitably include silanol groups (—SiOH, or —SiO$^-$) on the surface. The particle size of the abrasive may range of about 5 to 200 nm, or particularly of about 10 to 150 nm. The content of the abrasive in the polishing slurry composition may be of about 0.001 to 20 weight %, of about 0.01 to 10 weight %, or particularly of about 0.1 to 5 weight %, based on the total weight of the polishing slurry composition. When the particle size of the abrasive is less than the predetermined range, for example, less than about 5 nm, or its content is less than the predetermined amount, for example, less than about 0.001 weight %, the polishing rate of the metal film may be reduced. When the particle size of the abrasive is greater than the predetermined range, for example, greater than about 200 nm, or its content is greater than the predetermined amount, for example, greater than about 20 weight %, scratches on the metal film and the silicon oxide film may occur excessively.

The silanol group on the surface of the silica-based abrasive, i.e. a Si—OH or Si—O$^-$ functional group, may affect polishing rate of the abrasive. For instance, as the number of the silanol groups is increased on the surface of the abrasive, the polishing rate may be improved. When the abrasive has suitable amount of silanol groups having chemical activity on the surface of the abrasive, the abrasive may easily bond with the hydroxyl group on the surface of the oxide film and the surface of the oxide film may be easily removed by physical friction, so that the polishing rate may increase. In addition, the more the silanol groups, the lower the Si—O—Si condensation degree and the less the physical friction, so the scratches may be reduced. On the other hand, when the amount of silanol groups is excessively large on the surface of the abrasive, the dispersion stability in the acidic condition may be lowered and the pH may be changed during storage for a long time. When a storage stability problem such as a pH change occurs, even if the polishing performance such as a polishing rate is excellent, the product quality may not be maintained for a long period of time (e.g., for at least 3 to 6 months of storage life of a conventional slurry product) and may be reduced the merchantability.

The slurry composition may suitably include a silica-based abrasive having the number of the silanol groups on the surface of the abrasive of about 1 to 10 number/nm$^2$, of about 1 to 8 number/nm$^2$, or particularly of about 2 to 5 number/nm$^2$, thereby improving the polishing rate of the slurry composition and suppressing the occurrence of scratches. When the number of the silanol groups is less than about 1 number/nm$^2$, the polishing rate may be substantially reduced so that nonuniformity and scratches are increased. When the number of the silanol groups is greater than about 10 number/nm$^2$, the synergistic effect of the polishing rate may be reduced, and the activity of the surface of the abrasive may increase substantially so that the dispersion stability may be decreased, and aggregation and precipitation may occur.

The aluminum component as used in the chemical-mechanical polishing slurry composition of the present invention may be a pH stabilizer, which suppresses changes in pH during long-term storage of the slurry composition, thereby improving the stability of the slurry composition. The aluminum component may suitably include one or more aluminum salts (aluminum salt compounds). The aluminum component may further include one or more of a halide ion such as bromide (Br), chloride (Cl), or fluoride (F), a sulfate ($SO_4$), an ammonium ($NH_4$), a metal ion such as sodium (Na), or potassium (K), a hydroxide (OH), an alkyl group such as methyl ($CH_3$) or ethyl ($CH_2CH_3$), and a phosphorus (P). The aluminum component may suitably include one or more of a chloride (Cl), a sulfate ($SO_4$), and a potassium (K). For example, the aluminum component can include one or more selected from a group of aluminum chloride (e.g., $AlCl_3$), aluminum sulfate (e.g., $Al_2(SO_4)_3$), ammonium aluminum sulfate (e.g., $(NH_4)Al(SO_4)_2$), aluminum potassium sulfate (e.g., $KAl(SO_4)_2$), aluminum hydroxide (e.g., $Al(OH)_3$), trimethyl aluminum (e.g., $C_6H_{18}Al_2$), and aluminum phosphide (e.g., AlP). For example, the aluminum component may be aluminum chloride, aluminum sulfate, ammonium aluminum sulfate, aluminum potassium sulfate and mixture thereof; or aluminum chloride, aluminum sulfate, aluminum potassium sulfate and mixture thereof; or particularly aluminum chloride, aluminum sulfate and mixture thereof. Further, the aluminum component may be present in the slurry composition in the form of an aluminum salt and/or in combination with an abrasive and/or an aluminum ion. The polishing slurry composition of the present invention may include the aluminum component, which may be present in one or more state selected from the group consisting of an aluminum salt, an aluminum atom adsorbed on the abrasive surface, and an aluminum ion (e.g., $Al^{2+}$, or $Al^{3+}$).

In certain embodiments, the chemical-mechanical polishing slurry composition of the present invention may include the content of the aluminum component in an amount of about 0.000006 to 0.01 weight %, or particularly of about 0.0001 to 0.005 weight %, based on the total weight of the slurry composition. When the content of aluminum component is less than the predetermined amount, for example, less than about 0.000006 weight %, suppressing of the pH change with time may not be sufficient. When the content of aluminum component is greater than the predetermined amount, for example, greater than about 0.01 weight %, the particle size may be increased. For example, when the content of the aluminum component in slurry is greater than about 0.01 weight % in the acidic condition, the electric double layer is compressed regardless of the number of the silanol groups on the surface of the silica to cause aggregation of the abrasive and increase the particle size. The higher the ion concentration or the larger the valence of the ion, the more the electric double layer may be compressed to occur the flocculation. Preferably, the pH may be effectively stabilized without increasing the particle size just by adding the predetermined amount of the aluminum component. In addition, excessive use of aluminum component may be undesirable because it may contaminate the semiconductor process.

According to an aspect of the present invention, in the slurry composition of the present invention, when the number of the silanol groups on the surface of the abrasive and the content of the aluminum component satisfy the requirements of the following Equation 1, the pH change during the long-term storage of the slurry composition may be effectively suppressed and the slurry composition may be stabilized.

$$0.0005 \leq (S*C)*100 \leq 4.5,$$ [Equation 1]

wherein, S is the number of the silanol groups present on 1 $nm^2$ on the abrasive surface (unit: number/$nm^2$), and C is the content of the aluminum component (weight %) in the slurry composition. The silanol group number may be measured by typically used analysis methods in the related arts, for example, nuclear magnetic resonance (NMR) analysis, thermogravimetric analysis (TGA), Fourier transform infrared spectroscopy (FT-IR), titration using NaOH and the like.

When the content of the aluminum component is greater than the predetermined level, the more the number of the silanol groups(S) on the surface of the abrasive is, the more the thickness of the electric double layer may be compressed and then the dispersibility may be substantially decreased. Therefore, depending on the number of the silanol groups on the surface of the abrasive, when the excessive amount of aluminum component is contained, the dispersion stability may be deteriorated due to the increase in particle size. That is, the pH stabilizing effect may be obtained without increasing the particle size, by containing the predetermined amount of the aluminum components satisfying the requirements of Equation 1 depending on to the number of the silanol groups on the surface of the abrasive. When the product of the number of the silanol groups (S) on the surface of the abrasive and the content of the aluminum component (C)((S*C)*100) is greater than 4.5, a pH stabilizing effect may be obtained, however, the stability of the surface of the abrasive particles decreases and the particle size increases. On the contrary, when the product of the number of the silanol groups (S) on the surface of the abrasive and the content of the aluminum component (C) ((S*C)*100) is less than 0.0005, a pH stabilizing effect may not be sufficiently obtained. That is, in order to obtain long-term storage stability of the slurry composition, it is important that the product ((S*C)*100) of the number of the silanol groups (S) and the content of the aluminum component (C) is not greater than 4.5.

The remaining component constituting the chemical-mechanical polishing slurry composition may be a solvent. The solvent may suitably include a polar solvent such as water. Preferably, the solvent may be water such as deionized water and distilled water. The content of water may be of about 79.95 to 99 weight %, or particularly, of about 89.95 to 99 weight % based on the total weight of the slurry composition. The solvent (e.g., water) may constitute the remaining balance of the slurry composition. For example, when the composition of the present invention includes an abrasive, an aluminum component and other additives used as needed, the other component except for the abrasive, the aluminum component and the additives is water. The pH of the chemical-mechanical polishing slurry composition may be of about 1 to 6, or particularly of about 1 to 4. When the pH of the slurry composition is greater than the predetermined value, for example, greater than about 6, an oxide film may not be sufficiently formed, and the polishing rate may be decreased.

The chemical-mechanical polishing slurry composition according to the present invention may further comprise a pH adjusting agent and/or a biocide, if necessary. The biocide as used herein refers to a material, which may be a natural or synthetic material, used to prohibit growth of microorganism.

The pH adjusting agent as used herein may adjust the pH of the slurry composition to about 1 to 6, or particularly to about 1 to 4, and any pH adjusting agent (acid, base) used in a conventional slurry composition may be used without limitation. For example, the pH adjusting agent may suitably include one or more acids, for example, selected from the group consisting of nitric acid, hydrochloric acid, and sulfuric acid, bases such as potassium hydroxide, sodium hydroxide, tetramethylammonium hydroxide, and tetrabutylammonium hydroxide, or particularly, tetramethylammonium hydroxide, and tetrabutylammonium hydroxide. The content of the pH adjusting agent may be of about 0.0005 to 5 weight %, or particularly of about 0.001 to 1 weight % based on the total weight of the slurry composition. When the content of the pH adjusting agent is out of the above range, the pH of the slurry composition may become difficult to control, and the pH adjusting agent may act as a metal impurity to cause wafer contamination and defects.

The biocide as used herein may prevent the chemical-mechanical polishing slurry composition from being contaminated by microorganisms such as bacteria and fungi, and a commonly used product may be used. Preferably, the biocide may suitably include isothiazolinone or a derivative thereof. Non-limiting examples of the biocide may include one or more selected from the group consisting of methyl isothiazolinone (MIT, MI), chloromethyl isothiazolinone (CMIT, CMI, MCI), benzisothiazolinone (BIT), octylisothiazolinone (OIT, OI), dichlorooctylisothiazolinone (DCOIT, DCOI), and butylbenzisothiazolinone (BBIT). The content of the biocide may be of about 0.0001 to 0.05 weight %, or particularly of about 0.001 to 0.01 weight % by weight, based on the total weight of the slurry composition. When the content of the biocide is less than the predetermined amount, for example, less than about 0.0001 weight %, the effect of inhibiting microorganisms may not be sufficient, and when the content of the biocide is greater than about 0.05 weight %, the dispersibility of the slurry composition may be deteriorated.

The slurry composition according to the present invention can be used for polishing a metal film and an insulating film (e.g., oxide film such as $SiO_2$). Further, the slurry composition may include an oxidizing agent when the object to be polished is a metal film such as tungsten (W), aluminum (Al), copper (Cu) and the like. The oxidizing agent as used herein may rapidly form an oxide film on the surface of the metal film to facilitate the polishing of the metal film, and a conventional oxidizing agents used in the slurry composition for chemical-mechanical polishing may be used without limitation. The oxidizing agent may suitably include one or more selected from hydrogen peroxide and potassium iodate. The oxidizing agent may oxidize a metal film such as a wafer, a substrate, or the like to a corresponding oxide. The content of the oxidizing agent may be of about 0.005 to 10 weight %, or particularly of about 0.2 to 5 weight %, based on the total weight of the slurry composition. When the content of the oxidizing agent is less than about the predetermined amount, for example, less than about 0.005 weight %, the polishing rate of the metal film may be decreased, and when is content is greater than about the predetermined amount, for example, greater than about 20 weight %, the polishing efficiency may be decreased.

For example, when the object to be polished is a tungsten metal film, the slurry composition may further include a catalyst. As the catalyst, a catalyst commonly used in a slurry composition for chemical-mechanical polishing may be used without limitation. The catalyst may suitably include nano ferrosilicon (e.g., FeSi particles having a size in nanoscale), iron salt compounds (e.g., iron nitrate, iron chloride, iron sulfate, iron acetate, and the like) and the like. The content of the catalyst may be of about 0.00001 to 0.5 weight %, or particularly of about 0.001 to 0.05 weight %, based on the total weight of the slurry composition. When the content of the catalyst is less than the predetermined amount, for example, less than about 0.00001 weight %, the polishing rate of the metal film may be decreased. When its content is greater than about 0.5 weight %, the reactivity may increase excessively, and the polishing rate may become uneven.

In certain embodiments, the chemical-mechanical polishing slurry may include an amount of about 0.001 to 20 weight % of abrasive, an amount of about 0.000006 to 0.01 weight % of aluminum and the remaining balance of water, based on the total weight of the slurry composition. The chemical-mechanical polishing slurry may be suitably prepared by mixing and stirring, however the methods thereof are not limited thereto. Further, if necessary, the chemical-mechanical polishing slurry composition may further include an amount of about 0.0005 to 5 weight % of a pH adjusting agent, an amount of about 0.0001 to 0.05 weight % of a biocide, an amount of about 0.005 to 10 weight % of an oxidizing agent and an amount of about 0.00001 to 0.5 weight % of a catalyst, based on the total weight of the polishing slurry composition.

EXAMPLE

Hereinafter, the present invention will be described in more detail with reference to Examples, but the present invention is not limited by the following Examples.

Examples 1-11 and Comparative Examples 1-4: Manufacturing Slurry Composition

Components shown in following Table 1 were mixed at room temperature and stirred with a mechanical stirrer to prepare the slurry compositions (Examples 1 to 11, Comparative Examples 1 to 4).

TABLE 1

| | Abrasive | | pH stabilizer | | Aluminum component | Catalyst | | |
| --- | --- | --- | --- | --- | --- | --- | --- | --- |
| | Silica | content (weight %) | Kind | content (weight %) | content (weight %) | kind | content (weight %) | pH |
| Example 1 | Colloidal silica | 5 | Aluminum chloride | 0.0001 | 0.000006 | — | — | 3 |
| Example 2 | Colloidal silica | 5 | Aluminum chloride | 0.01 | 0.002 | — | — | 3 |
| Example 3 | Colloidal silica | 5 | Aluminum chloride | 0.05 | 0.01 | — | — | 3 |
| Example 4 | Colloidal silica | 5 | Aluminum sulfate | 0.01 | 0.0016 | — | — | 3 |

TABLE 1-continued

| | Abrasive | | pH stabilizer | | | Catalyst | | |
| --- | --- | --- | --- | --- | --- | --- | --- | --- |
| | Silica | content (weight %) | Kind | content (weight %) | Aluminum component content (weight %) | kind | content (weight %) | pH |
| Example 5 | Colloidal silica | 5 | Aluminum potassium sulfate | 0.01 | 0.0006 | — | — | 3 |
| Example 6 | Colloidal silica | 5 | Ammonium aluminum sulfate | 0.01 | 0.001 | — | — | 3 |
| Example 7 | Fumed silica | 5 | Aluminum chloride | 0.01 | 0.002 | Nano ferro silicon | 0.003 | 3 |
| Example 8 | Fumed silica | 5 | Aluminum potassium sulfate | 0.01 | 0.0006 | Nano ferro silicon | 0.003 | 3 |
| Example 9 | Fumed silica | 5 | Ammonium aluminum sulfate | 0.02 | 0.002 | Iron nitrate | 0.015 | 3 |
| Example 10 | Fumed silica | 5 | Ammonium aluminum sulfate | 0.02 | 0.002 | Iron sulfate | 0.015 | 3 |
| Example 11 | Fumed silica | 5 | Ammonium aluminum sulfate | 0.02 | 0.002 | Ferric chloride | 0.015 | 3 |
| Comparative Example 1 | Colloidal silica | 5 | — | — | — | — | — | 3 |
| Comparative Example 2 | Fumed silica | 5 | — | — | — | Nano ferro silicon | 0.003 | 3 |
| Comparative Example 3 | Colloidal silica | 5 | Aluminum chloride | 0.00002 | 0.000004 | — | — | 3 |
| Comparative Example 4 | Colloidal silica | 5 | Aluminum chloride | 0.08 | 0.016 | — | — | 3 |

Experimental Example 1: Identifying Change of Slurry Composition Over Time

The slurry compositions prepared in Examples 1 to 11 and Comparative Examples 1 to 4 were stored at room temperature for 6 months, and then changes in pH and particle size with time were measured using a pH analyzer (Metrohm 704, Metrohm) and a particle size analyzer (ELS-Z, Otsuka Electronics). The change with time of pH is shown in the following Table 2, and the change with time (unit: nm) of the particle size is shown in Table 3 below.

TABLE 2

| No. | Storage temperature | $0^{th}$ day | $15^{th}$ day | $30^{th}$ day | $60^{th}$ day | $120^{th}$ day | $150^{th}$ day | $180^{th}$ day |
| --- | --- | --- | --- | --- | --- | --- | --- | --- |
| Example 1 | Room temperature | 2.99 | 3.01 | 3.05 | 3.07 | 3.07 | 3.08 | 3.07 |
| Example 2 | Room temperature | 3.02 | 3 | 2.99 | 3.01 | 3 | 3 | 3.01 |
| Example 3 | Room temperature | 3 | 2.98 | 3.01 | 3 | 2.99 | 3.01 | 3.00 |
| Example 4 | Room temperature | 3.03 | 3 | 3.02 | 3.01 | 3.03 | 3 | 3.02 |
| Example 5 | Room temperature | 2.98 | 3.01 | 3 | 3.02 | 2.99 | 3.01 | 3.01 |
| Example 6 | Room temperature | 3.02 | 2.99 | 3 | 3.01 | 3.03 | 3 | 2.99 |
| Example 7 | Room temperature | 3.01 | 3 | 2.99 | 3.01 | 3.02 | 3 | 3.01 |
| Example 8 | Room temperature | 3 | 3.01 | 3 | 3 | 3.01 | 3.02 | 3.02 |
| Example 9 | Room temperature | 3 | 3 | 2.99 | 3.01 | 3.03 | 3.02 | 3.03 |
| Example 10 | Room temperature | 2.99 | 2.98 | 3 | 3.01 | 3 | 3.02 | 3.02 |
| Example 11 | Room temperature | 3 | 3.01 | 3 | 3.02 | 3.01 | 3.01 | 3.03 |
| Comparative Example 1 | Room temperature | 3.01 | 3.12 | 3.15 | 3.21 | 3.32 | 3.57 | 3.78 |
| Comparative Example 2 | Room temperature | 3 | 3.1 | 3.13 | 3.17 | 3.21 | 3.33 | 3.34 |

TABLE 2-continued

| No. | Storage temperature | $0^{th}$ day | $15^{th}$ day | $30^{th}$ day | $60^{th}$ day | $120^{th}$ day | $150^{th}$ day | $180^{th}$ day |
|---|---|---|---|---|---|---|---|---|
| Comparative Example 3 | Room temperature | 3.01 | 3.07 | 3.12 | 3.13 | 3.16 | 3.18 | 3.22 |
| Comparative Example 4 | Room temperature | 3.01 | 3.01 | 3 | 3.02 | 3 | 3.03 | 3.02 |

TABLE 3

| No. | Storage temperature | $0^{th}$ day | $15^{th}$ day | $30^{th}$ day | $60^{th}$ day | $120^{th}$ day | $150^{th}$ day | $180^{th}$ day |
|---|---|---|---|---|---|---|---|---|
| Example 1 | Room temperature | 89 | 90 | 90 | 89 | 91 | 91 | 91 |
| Example 2 | Room temperature | 91 | 89 | 91 | 88 | 90 | 92 | 91 |
| Example 3 | Room temperature | 90 | 91 | 90 | 90 | 89 | 92 | 92 |
| Example 4 | Room temperature | 90 | 89 | 90 | 90 | 91 | 90 | 91 |
| Example 5 | Room temperature | 88 | 90 | 89 | 89 | 90 | 91 | 92 |
| Example 6 | Room temperature | 91 | 91 | 90 | 91 | 90 | 90 | 91 |
| Example 7 | Room temperature | 109 | 110 | 110 | 109 | 111 | 110 | 111 |
| Example 8 | Room temperature | 111 | 110 | 111 | 109 | 111 | 111 | 110 |
| Example 9 | Room temperature | 110 | 109 | 110 | 110 | 110 | 111 | 110 |
| Example 10 | Room temperature | 110 | 110 | 111 | 110 | 109 | 110 | 111 |
| Example 11 | Room temperature | 109 | 110 | 111 | 110 | 110 | 111 | 113 |
| Comparative Example 1 | Room temperature | 90 | 90 | 90 | 93 | 93 | 96 | 101 |
| Comparative Example 2 | Room temperature | 110 | 109 | 109 | 112 | 113 | 113 | 115 |
| Comparative Example 3 | Room temperature | 90 | 89 | 89 | 92 | 91 | 93 | 94 |
| Comparative Example 4 | Room temperature | 91 | 107 | 120 | 141 | 185 | 225 | 260 |

As shown in Table 2, as Comparative Example 3 included an amount of 0.000004 weight % of the aluminum component, the change in pH over time was reduced as compared with Comparative Example 1, but the effect thereof was insufficient. On the other hand, as shows in in Examples 1 to 11 and Comparative Example 4 in which the aluminum component content was 0.000006 weight % or greater, there was almost no change in pH over time compared to Comparative Examples 1 to 3. In addition, as shown in Table 3, as Comparative Example 3 included an amount of 0.000004 weight % of the aluminum component, the particle size was hardly changed but the effect of suppressing the pH change was insufficient. Further as Examples 1 to 11 included an amount of about 0.000006 to 0.01 weight % of the aluminum component, the particle size hardly changed over time compared with Comparative Examples 1 and 2. However, when the aluminum component content was 0.01 weight % or greater, the particle size was rather increased as compared with Comparative Example 1, as in Comparative Example 4. Therefore, change of pH in the slurry composition with time was prevented by using an appropriate amount of the aluminum component.

Experimental Example 2: Measuring Polishing Rate

Tungsten (W) film of 8 inches and insulating layer (PE-TEOS) of 8 inches (blanket wafer) were loaded on Mirra 3400 of polisher (Applied Materials, Inc.) on which IC-1010 of polishing pad (Rohm & Haas Co. Ltd.) was mounted. Next, the tungsten film and the insulating layer were polished for 60 seconds while supplying the slurry compositions of the Examples 1 to 8 and the Comparative Examples 1 to 4 to the wafer. In Examples 7 and 8 and Comparative Example 2, 2 wt % of hydrogen peroxide was further mixed before the slurry composition was injected. The polishing conditions were listed on following Table 4. The hydrogen peroxide was mixed prior to polishing, since hydrogen peroxide decomposes when used as an oxidizing agent after mixing with the slurry composition. In the following Table 4, IC pressure, RR pressure, EC pressure, UC pressure each represents respectively Inter Chamber Pressure, Retainer Ring Pressure, External Chamber Pressure, Upper Chamber Pressure, which shows pressure condition in respective part of head on which the wafer was mounted.

TABLE 4

| Platen rate | Head rate | IC pressure | RR pressure | EC pressure | UC pressure | Slurry flow rate |
|---|---|---|---|---|---|---|
| 84 rpm | 78 rpm | 3.6 psi | 10.4 psi | 5.2 psi | 5.2 psi | 200 ml/min |

Removal rate of tungsten film and insulating layer (Angstrom (Å)/min, hereinafter, referred to as R/R) was measured by using a resistance measuring instrument (CMT-2000, 4-point probe, Chang-min Tech Co., Ltd./Thermawave OP-2600, KLA TENCOR), and the result thereof was shown in following Table 5(SiO$_2$ polishing rate) and Table 6 (tungsten (W) polishing rate). Here, the polishing rate was calculated by using "polishing rate=thickness before CMP-thickness after CMP".

TABLE 5

| | SiO$_2$ polishing rate (Å/min) |
|---|---|
| Example 1 | 1,002 |
| Example 2 | 1,006 |
| Example 3 | 995 |
| Example 4 | 1,031 |
| Example 5 | 1,017 |
| Example 6 | 1,023 |
| Comparative Example 1 | 1,020 |
| Comparative Example 3 | 1,048 |
| Comparative Example 4 | 969 |

TABLE 6

| | Tungsten polishing rate (Å/min) |
|---|---|
| Example 7 | 3,300 |
| Example 8 | 3,197 |
| Comparative Example 2 | 3,250 |

As shown in Tables 5 and 6, it can be seen that when the content of aluminum chloride was increased, the SiO$_2$ polishing rate was not influenced, and as shown in the Examples 7 and 8, that the application of each 0.01 weight % of aluminum chloride, aluminum potassium sulfate did not affect the polishing rate of tungsten compared to Comparative Example 2.

Reference Examples 1 to 10: Measuring Scratch Inhibiting Effect of Slurry Composition According to Number of Silanol Groups A slurry composition was prepared including colloidal silica 5 weight % having the number of the silanol groups as shown in Table 7 below, a pH adjusting agent (nitric acid or tetramethylammonium hydroxide) to adjust the pH to 2.5 and the remaining distilled water. The measurement of the number of the silanol groups (p[number/nm$^2$]) was carried out as follows using titration. First, an appropriate amount (100 ml or less) of the solution was prepared so that the total area of silica is 90 m$^2$, and then a titration sample (X [ml]) was prepared. Next, the pH of the slurry composition was adjusted to 3 using 0.1 M HNO$_3$ aqueous solution and stabilized sufficiently until the pH change amount became 0.01 or less. Thereafter, the pH was titrated to 10 with a 0.1 M NaOH aqueous solution at a rate of 0.5 mV/min or less. The required amount of 0.1M NaOH (Y [mol]) for areas without change in the number of H$^+$ and OH$^-$ moles of the titrant solution was determined. The required amount (Y) was divided by the initial amount (X [ml]) of the titration sample to obtain [OH$^-$] (B [mol/L]) which was adsorbed on the silica particles (B=Y/X). From the following Equation (2), the silanol group density of the silica particles was calculated.

$$\rho = \frac{(B \cdot N_A)}{(S_{BET} \cdot Cp \cdot 10^{18})} \quad \text{[Equation 2]}$$

Wherein, $N_A$[number/mol] represents Avogadro's number, $S_{BET}$[m$^2$/g] represents specific surface area of silica particles and Cp[g/L] represents concentration of silica particles.

After polishing an insulating film (PE-TEOS) blanket wafer for 60 seconds by using the slurry composition prepared, the number of scratches formed on the wafer was measured using a Negevtech defect inspection equipment. The polishing rate of the SiO$_2$ insulating film of the slurry composition and the amount of pH change before and after storage for 30 days at room temperature were measured and are shown in Table 7 together.

TABLE 7

| | Silica content (weight %) | pH | Number of Silanol (number/nm$^2$) | SiO$_2$ polishing rate (Å/min) | Scratch (number) | pH 0$^{th}$ day | pH 30$^{th}$ day | Change amount |
|---|---|---|---|---|---|---|---|---|
| Reference Example 1 | 5 | 2.5 | 0.5 | 525 | 48 | 2.51 | 2.63 | 0.12 |
| Reference Example 2 | 5 | 2.5 | 0.8 | 536 | 52 | 2.5 | 2.61 | 0.11 |
| Reference Example 3 | 5 | 2.5 | 1.2 | 794 | 35 | 2.5 | 2.59 | 0.09 |
| Reference Example 4 | 5 | 2.5 | 1.6 | 812 | 37 | 2.5 | 2.62 | 0.12 |
| Reference Example 5 | 5 | 2.5 | 2.3 | 885 | 18 | 2.51 | 2.65 | 0.14 |
| Reference Example 6 | 5 | 2.5 | 3.8 | 1,002 | 20 | 2.49 | 2.67 | 0.18 |
| Reference Example 7 | 5 | 2.5 | 4.9 | 1,227 | 15 | 2.5 | 2.75 | 0.25 |
| Reference Example 8 | 5 | 2.5 | 9.7 | 1,374 | 7 | 2.5 | 2.88 | 0.38 |
| Reference Example 9 | 5 | 2.5 | 10.9 | 1,311 | 9 | 2.51 | 4.25 | 1.74 |

TABLE 7-continued

|  | Silica content (weight %) | pH | Number of Silanol (number/nm$^2$) | SiO$_2$ polishing rate (Å/min) | Scratch (number) | pH 0$^{th}$ day | pH 30$^{th}$ day | Change amount |
|---|---|---|---|---|---|---|---|---|
| Reference Example 10 | 5 | 2.5 | 11.8 | 1,297 | 10 | 2.5 | 3.99 | 1.49 |

As shown in Table 7, as the number of the silanol groups increased on the surface of the silica, the polishing rate of the oxide increased while the scratch decreases. In addition, as the number of the silanol groups on the abrasive surface increased, pH was increased during storage at room temperature, and especially, when the number of the silanol groups was more than 10/nm$^2$, the change amount in pH rapidly increased.

Examples 12-23, Comparative Examples 5-10: Long-Term Storage Stability Measurement of Slurry Composition Depending on Number of Silanol Groups and Aluminum Component Content The slurry composition was prepared comprising 5 weight % of colloidal silica having the number of the silanol groups as shown in Table 8 below, various contents of aluminum sulfate, a pH adjusting agent (nitric acid or tetramethylammonium hydroxide) to adjust the pH to 2.5, and the remaining distilled water. The pH change amount and the particle size change amount of the slurry composition thus prepared were measured and shown in Table 9.

TABLE 8

|  | Silica content (weight %) | pH | Number of Silanol (number/nm$^2$) | Aluminum sulfate content (weight %) | Aluminum component content (weight %) | (S * C) * 100 |
|---|---|---|---|---|---|---|
| Comparative Example 5 | 5 | 2.5 | 3.8 | 0 | 0 | 0 |
| Comparative Example 6 | 5 | 2.5 | 0.5 | 0.000032 | 0.000005 | 0.0003 |
| Comparative Example 7 | 5 | 2.5 | 0.5 | 0.000044 | 0.000007 | 0.0004 |
| Example 12 | 5 | 2.5 | 0.5 | 0.000063 | 0.00001 | 0.0005 |
| Example 13 | 5 | 2.5 | 0.8 | 0.000038 | 0.000006 | 0.0005 |
| Comparative Example 8 | 5 | 2.5 | 1.2 | 0.000019 | 0.000003 | 0.0004 |
| Example 14 | 5 | 2.5 | 1.2 | 0.00032 | 0.00005 | 0.006 |
| Example 15 | 5 | 2.5 | 1.2 | 0.019 | 0.003 | 0.36 |
| Example 16 | 5 | 2.5 | 1.6 | 0.019 | 0.003 | 0.48 |
| Example 17 | 5 | 2.5 | 2.3 | 0.00004 | 0.000006 | 0.0014 |
| Example 18 | 5 | 2.5 | 2.3 | 0.038 | 0.006 | 1.4 |
| Example 19 | 5 | 2.5 | 3.8 | 0.025 | 0.004 | 1.5 |
| Comparative Example 9 | 5 | 2.5 | 3.8 | 0.10 | 0.015 | 5.7 |
| Example 20 | 5 | 2.5 | 4.9 | 0.0013 | 0.0002 | 0.098 |
| Example 21 | 5 | 2.5 | 4.9 | 0.057 | 0.009 | 4.41 |
| Comparative Example 10 | 5 | 2.5 | 4.9 | 0.076 | 0.012 | 5.9 |
| Example 22 | 5 | 2.5 | 9.7 | 0.019 | 0.003 | 2.9 |
| Example 23 | 5 | 2.5 | 9.7 | 0.044 | 0.007 | 6.8 |

TABLE 9

|  | (S * C) * 100 | pH | | | | Particle size | | | |
| --- | --- | --- | --- | --- | --- | --- | --- | --- | --- |
|  |  | $0^{th}$ day | $90^{th}$ day | $180^{th}$ day | Change | $0^{th}$ day | $90^{th}$ day | $180^{th}$ day | Change amount |
| Comparative Example 5 | 0 | 2.49 | 3.81 | 4.56 | 2.07 | 89 | 90 | 90 | 1 |
| Comparative Example 6 | 0.0003 | 2.50 | 2.73 | 3.55 | 1.05 | 89 | 89 | 89 | 0 |
| Comparative Example 7 | 0.0004 | 2.51 | 2.77 | 3.33 | 0.82 | 90 | 91 | 90 | 0 |
| Example 12 | 0.0005 | 2.50 | 2.52 | 2.54 | 0.04 | 89 | 90 | 90 | 1 |
| Example 13 | 0.0005 | 2.50 | 2.50 | 2.56 | 0.06 | 90 | 90 | 90 | 0 |
| Comparative Example 8 | 0.0004 | 2.51 | 3.74 | 4.02 | 1.51 | 90 | 89 | 91 | 1 |
| Example 14 | 0.006 | 2.51 | 2.50 | 2.53 | 0.02 | 91 | 91 | 92 | 1 |
| Example 15 | 0.36 | 2.50 | 2.52 | 2.56 | 0.06 | 90 | 91 | 90 | 0 |
| Example 16 | 0.48 | 2.50 | 2.51 | 2.57 | 0.07 | 90 | 91 | 91 | 1 |
| Example 17 | 0.0014 | 2.49 | 2.52 | 2.58 | 0.09 | 89 | 90 | 91 | 2 |
| Example 18 | 1.4 | 2.50 | 2.51 | 2.52 | 0.02 | 90 | 91 | 91 | 1 |
| Example 19 | 1.5 | 2.50 | 2.50 | 2.51 | 0.01 | 90 | 89 | 91 | 1 |
| Comparative Example 9 | 5.7 | 2.50 | 2.51 | 2.53 | 0.03 | 90 | 193 | 521 | 431 |
| Example 22 | 0.098 | 2.51 | 2.52 | 2.56 | 0.05 | 90 | 89 | 90 | 0 |
| Example 21 | 4.41 | 2.51 | 2.50 | 2.50 | 0.01 | 91 | 91 | 91 | 0 |
| Comparative Example 10 | 5.9 | 2.49 | 2.51 | 2.51 | 0.02 | 89 | 130 | 205 | 116 |
| Example 22 | 2.9 | 2.50 | 2.51 | 2.51 | 0.01 | 90 | 90 | 91 | 1 |
| Example 23 | 6.8 | 2.50 | 2.49 | 2.52 | 0.02 | 90 | 121 | 158 | 68 |

As shown in Table 9, when the product of the number of the silanol groups on the silica surface in the slurry and the content of the aluminum component satisfied the condition of 0.0005≤(S*C)*100≤4.5, stabilization of the pH for a long period at room temperature was established more efficiently. As in Comparative Examples 9 and 10, when (S*C)*100 exceeded 4.5, the pH was stabilized while the particle size increased sharply. As in Comparative Examples 5 to 8, when the (S*C)*100 was less than 0.0005, the pH stabilizing effect was poor.

Therefore, the aforementioned embodiments are merely illustrative but are construed as limiting the present invention. The scope of the present invention is represented by the claims below rather than the detailed description, and the meaning and scope of the claims and all modifications or variations derived from equivalents thereof are intended to be incorporated within the scope of the present invention.

What is claimed:

1. A polishing slurry composition comprising:
   an abrasive;
   an amount of about 0.000006 to 0.01 weight % of an aluminum component based on the total weight of the polishing slurry composition; and
   a solvent,
   wherein the abrasive comprises one or more selected from the group consisting of fumed silica and colloidal silica,
   wherein the abrasive is selected to have a number of silanol groups on a surface thereof from about 1 $nm^{-2}$ to about 10 $nm^{-2}$,
   wherein the number of silanol groups on the surface of the abrasive and a content of the aluminum component are determined such that following Equation 1 is satisfied:

$$0.0005 \leq (S*C)*100 \leq 4.5 \quad \text{[Equation 1]}$$

wherein, S is the number of silanol groups present on 1 $nm^2$ of the surface of the abrasive (unit: number/$nm^2$), and C is the content of the aluminum component (weight %) in the polishing slurry composition, and
   wherein at least some of the aluminum component is present within the solvent.

2. The polishing slurry composition of claim 1, wherein the solvent comprises water.

3. The polishing slurry composition of claim 1, wherein the polishing slurry composition comprises the abrasive in an amount of about 0.001 to 20 weight % based on the total weight of the polishing slurry composition.

4. The polishing slurry composition of claim 1, wherein the aluminum component comprises one or more selected from the group consisting of an aluminum salt, an aluminum atom and an aluminum ion.

5. The polishing slurry composition of claim 4, wherein the aluminum component is attached or absorbed on a surface of the abrasive.

6. The polishing slurry composition of claim 4, wherein the aluminum component further comprises one or more selected from the group consisting of chloride (Cl), sulfate ($SO_4$), ammonium ($NH_4$), potassium (K), hydroxide (OH), a methylate ($CH_3$) and phosphorus (P).

7. The polishing slurry composition of claim 1, further comprising:
   a pH adjusting agent comprising one or more selected from the group consisting of nitric acid, hydrochloric acid, sulfuric acid, potassium hydroxide, sodium hydroxide, tetramethylammonium hydroxide, and tetrabutylammonium hydroxide.

8. The polishing slurry composition of claim 1, further comprising:
   an amount of about 0.005 to 10 weight % of an oxidizing agent based on the total weight of the polishing slurry composition.

9. The polishing slurry composition of claim 1, further comprising:
   an amount of about 0.0001 to 0.05 weight % of a biocide based on the total weight of the polishing slurry composition.

10. The polishing slurry composition of claim 1, further comprising:

an amount of about 0.00001 to 0.5 weight % of a catalyst comprising nano ferrosilicon or iron salt compound based on the total weight of the polishing slurry composition.

11. A polishing slurry composition comprising:
an amount of about 0.001 to 20 weight % of an abrasive;
an amount of about 0.000006 to 0.01 weight % of an aluminum component;
an amount of about 0.00001 to 0.5 weight % of a catalyst comprising nano ferrosilicon or iron salt compound; and
a solvent constituting the remaining balance of the polishing slurry composition,
wherein all the weight % are based on the total weight of the polishing slurry composition,
wherein the abrasive comprises one or more selected from the group consisting of fumed silica and colloidal silica,
wherein the abrasive is selected to have a number of silanol groups on a surface thereof from about 1 $nm^{-2}$ to about 10 $nm^{-2}$,
wherein the number of silanol groups on the surface of the abrasive and a content of the aluminum component are determined such that following Equation 1 is satisfied:

$$0.0005 \leq (S*C)*100 \leq 4.5 \quad \text{[Equation 1]}$$

wherein, S is the number of silanol groups present on 1 $nm^2$ of the surface of the abrasive (unit: number/$nm^2$), and C is the content of the aluminum component (weight %) in the polishing slurry composition, and
wherein at least some of the aluminum component is present within the solvent.

12. The polishing slurry composition of claim 11, wherein the solvent comprises water.

13. The polishing slurry composition of claim 11, further comprising:
a pH adjusting agent to adjust the pH to 1 to 6; and
an amount of about 0.0001 to 0.05 weight % of a biocide based on the total weight of the polishing slurry composition, and wherein the pH adjusting agent comprises one or more selected from the group consisting of nitric acid, hydrochloric acid, sulfuric acid, potassium hydroxide, sodium hydroxide, tetramethylammonium hydroxide, and tetrabutylammonium hydroxide.

14. The polishing slurry composition of claim 11, further comprising:
an amount of about 0.005 to 10 weight % of an oxidizing agent based on the total weight of the polishing slurry composition.

15. A polishing slurry composition comprising:
an amount of about 0.001 to 20 weight % of an abrasive;
an amount of about 0.000006 to 0.01 weight % of an aluminum component;
an amount of about 0.00001 to 0.5 weight % of a catalyst comprising nano ferrosilicon or iron salt compound;
an amount of about 0.005 to 10 weight % of an oxidizing agent; and
a solvent constituting the remaining balance of the polishing slurry composition, wherein the solvent comprises water,
all the weight % are based on the total weight of the polishing slurry composition,
wherein the abrasive comprises one or more selected from the group consisting of fumed silica and colloidal silica,
wherein the abrasive is selected to have a number of silanol groups on a surface thereof from about 1 $nm^{-2}$ to about 10 $nm^{-2}$,
wherein the number of silanol groups on the surface of the abrasive and a content of the aluminum component are determined such that following Equation 1 is satisfied:

$$0.0005 \leq (S*C)*100 \leq 4.5 \quad \text{[Equation 1]}$$

wherein, S is the number of silanol groups present on 1 $nm^2$ of the surface of the abrasive (unit: number/$nm^2$), and C is the content of the aluminum component (weight %) in the polishing slurry composition, and
wherein at least some of the aluminum component is present within the solvent.

* * * * *